United States Patent [19]

Lagendijk et al.

[11] Patent Number: 4,851,255
[45] Date of Patent: Jul. 25, 1989

[54] ION IMPLANT USING TETRAFLUOROBORATE

[75] Inventors: Andre Lagendijk, Oceanside; Shantia Riahi, Vista, both of Calif.

[73] Assignee: Air Products and Chemicals, Inc., Allentown, Pa.

[21] Appl. No.: 190,815

[22] Filed: May 6, 1988

Related U.S. Application Data

[62] Division of Ser. No. 946,784, Dec. 29, 1986.

[51] Int. Cl.[4] .............................................. B05D 3/06
[52] U.S. Cl. ...................................... 427/38; 427/47; 437/21; 437/22
[58] Field of Search ...................... 427/38, 47; 437/21, 437/22

[56] References Cited

U.S. PATENT DOCUMENTS 4,622,236 11/1986 Morimoto et al. ..................... 427/38
4,634,600 1/1987 Shimizu et al. ....................... 427/38
4,656,052 4/1987 Satou et al. ............................ 427/38
4,759,836 7/1988 Hill et al. .......................... 427/38 X Primary Examiner—Bernard Pianalto
Attorney, Agent, or Firm—James C. Simmons; William F. Marsh

[57] ABSTRACT

Metal tetrafluoroborates, alkali and alkaline earth tetrafluoroborates in particular, and preferably lithium tetrafluoroborate are used as ion source materials in ion implantation of semiconductor materials with boron.

11 Claims, 1 Drawing Sheet

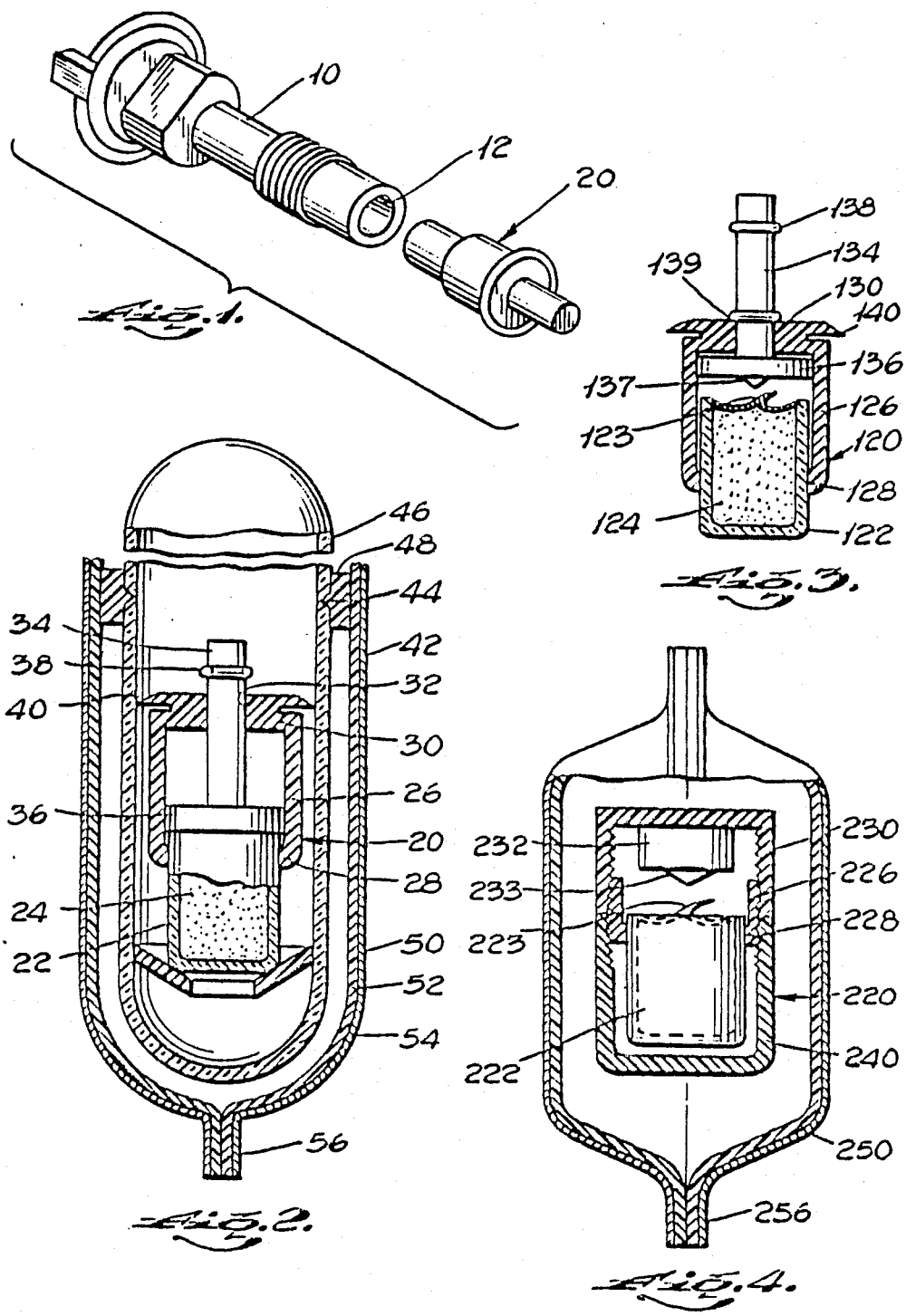

ION IMPLANT USING TETRAFLUOROBORATE

This is a divisional of co-pending application Ser. No. 946,784 filed on Dec. 29, 1986.

FIELD OF THE INVENTION

This invention relates to ion implantation generally and more specifically relates to the manufacture of semiconductor devices using ion implant techniques.

BACKGROUND OF THE INVENTION

Ion implantation is a well-known and widely used process for injecting atoms into a solid material to selected depths and concentrations in selected areas. Ion implant accelerators are similar to isotope separators but typically have an added acceleration stage and field controls for precisely locating the beam of ions and controlling the energy and flux of the beam of ions to cause the desired penetration and concentration. Atoms of the selected chemical element to be ionized are ionized by collisions with electrons in an electrical discharge in a gas at low pressure and pass through an orifice into a highvacuum region where they are accelerated by an electric field to a an intermediate energy, typically from 10 to 30 ke V, where they are analyzed by a magnetic field based upon the e/m ratio, i.e. the ratio of electronic charge over mass. The selected ion beam passes through an analyzer slit, and the ions are accelerated to the desired energy, and the beam passes through a refocussing field, typically a quadrupole lens, is deflected by a scanner system, and collimated by a defined aperture and allowed to strike the target. When the ions penetrate the target lattice, they lose energy through collisions with lattice atoms and come to rest as part of the target. There are, of course, a large number of variations between specific ion implant systems but the foregoing principles apply generally to ion implant processes. The ion implant technique is described, inter alia, in U.S. Pat. Nos. 2,750,541, 2,787,564 and 2,842,466, which are incorporated herein. The ion implant method is also described in many texts, encyclopedias and scientific journals; see, e.g. ENCYCLOPEDIA OF SEMICONDUCTOR TECHNOLOGY, "Ion Implantation" pp. 397–410, John Wiley & Sons (1984) and the numerous references cited therein; see also, Kirk Othmer CONCISE ENCYCLOPEDIA OF CHEMICAL TECHNOLOGY, "Ion Implantation", p. 666 et seq., John Wiley & Sons (1985); and ION IMPLANTATION, J. K. Hirvonen, ed., Academic Press, Inc., (1980). Since the equipment and methods of ion implantation are so thoroughly described and widely used in the semiconductor industry, those skilled in the art are familiar with these methods and devices and may refer to any of the many excellent journal, text and patent descriptions for details. Manufacturer's manuals, provided with specific items of equipment are the best source for details as to a given piece of equipment.

This invention relates to the use of a particular class of chemicals as ion source materials and, consequently, to a modified method; i.e. a method which is modified in that it utilizes a novel source of ions.

Ions are introduced into the ion implant equipment periodically. This generally requires cooling the implant equipment down, opening the high vacuum to at least some atmospheric exposure, introducing the new charge of ion source material into a receptacle, closing up the equipment, pumping the ion implant and accelerator chambers down to a high vacuum, and placing the equipment into operation again. This procedure is necessarily very expensive in terms of lost production and wasted time in a very expensive piece of equipment. Ion implant devices not infrequently cost over one million dollars and it is necessary to maximize production time to recoup the investment in saleable product.

While the ion implant equipment is very precise elegant and complex in design and operation, the introduction of ion source material is a relatively simple, largely manual operation. Basically, the charge of ion source material is, according to the prior art, simply pushed, poured or dropped into a small chamber in a Source Vaporizor which is then closed, after which the entire system is pumped down using well-known rotory and oil diffusion vacuum pumps. Source Vaporizers of the type under consideration are sold by various manufacturers, one of which is described as a Nova NV-10 (TM) Series Source Vaporizer. This, however, is merely exemplary and other source vaporizers are well-known to those skilled in the art.

For more than a decade, ion implantation has been a chief step in the industrial processing of semiconductor devices; in particular, large-scale integrated circuits; see, for example, ION IMPLANTATION IN SEMICONDUCTORS, Sartwell, et al., editors, Plenum Press, New York (1977). It is within this art that the present invention lies and to which it is an improvement.

SUMMARY OF THE INVENTION

The present invention is an improvement in the ion implantation process described above, the improvement comprising introducing as the ion source material a metal haloborate compound.

The compounds used in the method and manufacture of this invention comprise:

$$M(BX_4)_n$$

wherein M is an alkali or alkaline earth metal, B is boron, X is fluorine, chlorine or iodine, and n is the ionic valence of M.

The most preferred of the compounds is $LiBF_4$, lithium fluoborate. Generally, fluoborates are preferred but other haloborates may, for most applications, be considered equivalent though not possessing all the advangates of the fluorine species. Generally, the preferred compounds are lithium, sodium, magnesium, potassium, calcium and zinc tetrafluoroborates. Mono-, di-, and tri-valent metal tetrahaloborates which vaporize in vacuum at temperatures of from about 100° C. to 500° C. and which are available or can be manufactured in highly pure form may be considered equivalents. Likewise, ammonium tetrahaloborate may be considered to be equivalent for limited applications, though the vapor pressure of this compound is too high for commonly used applications.

The invention may be described as the improved method which comprises the steps of (a) evaporating a metal tetrafluoroborate which evaporates under a vacuum of from approximately $10^{-3}$ to $10^{-5}$ torr in the temperature range of from approximately 100° C. to 500° C. at a rate sufficient to form an effective ion implant beam in an ion implant instrument; (b) ionizing boron; (c) accelerating the boron ions; (d) electromagnetically selecting the boron ions to be implanted in the target; and (e) accelerating and directing a beam of the selected ions to a predetermined point or location on the target.

The article of manufacture of this invention comprises a charge of tetrahaloflouroborate configured and dimensioned to be received in an ion source vaporizer secured to means for inserting the charge into an ion source vaporizer of an ion implant device. As an article of manufacture, trade and commerce, the invention thus, in an exemplary form, comprises, in combination, a charge of metal tetrahaloborate, preferably lithium tetrafluoroborate, charge forming means configuring the charge into a size and shape for being received in a source vaporizer of an ion implant instrument, and enclosure means for enclosing at least a portion of the charge forming means and for positioning the charge forming means in the well of a source vaporizer.

BRIEF DESCRIPTION OF THE DRAWING

FIG. 1 is a perspective, exploded view of a preferred form of the article of manufacture of this invention, a charge for introduction into a source vaporizer of an ion implant instrument, showing a portion of the source vaporizer.

FIG. 2 is a side view, enlarged and partially cut away, showing partially in cross-section the article of manufacture of this invention.

FIG. 3 is a partial side view of an alternative embodiment of the manufacture of this invention wherein the charge container includes a breakseal.

FIG. 4 is another alternative embodiment of the manufacture of the present invention.

DESCRIPTION OF THE PREFERRED EMBODIMENT

The invention comprises, in the form of an article of manufacture, comprises apparatus for providing ion source material to the source vaporizer of ion implant equipment, an exemplary source vaporizer being depicted at 10 in FIG. 1 comprising a body of well-known configuration and a well 12 which is configured, designed and adapted to receive a charge of the ion source material. The well 12 is about 22 mm in depth and 16 mm in diameter and generally cylindrical in configuration. The article of manufacture 20 shown in FIG. 1 is one feature of the present invention, providing means for providing ion source material into the source vaporizer.

Referring to FIG. 2 next, a preferred, complete article of manufacture is depicted. The assembly 20 comprises a charge forming device 22 which holds the charge 24 of ion source material in its desired configuration and protects it from contamination. The charge forming device 22 is preferably formed of quartz, although for certain low temperature applications it may be formed of inert polymer or borosilicate glass. The charge forming device 22 is, in the embodiment of FIG. 1, an open top right cylindrical vessel being so configured and dimensioned as to be loosely received in the well of the vaporizer.

The charge forming device is received in an enclosure 26 which comprises a generally cylindrical receiving body having an opening 28 which includes a sealing ring which fits very snuggly around and seals against the outer cylindrical walls of the charge forming device 22, permitting the charge forming device 22, upon the application of force, to move recipically in the enclosure 26 with the walls thereof in sealing relationship therewith.

The enclosure 26 is generally in the form of a hollow cylinder formed of suitable inert polymer, preferably a fluorocarbon or fluorochlorocarbon polymer, such as Teflon (TM) for example, which is self-lubricating and forms an excellent seal with quartz, glass or metal. One end of the cylinder of the enclosure 26 comprises an end cap 30 which has a passage 32 therethrough slidably receiving the shaft 34 which, in turn, is part of a plunger or piston, the distal portion being generally discoid in configuration, as shown at 36, and forming a seal against the interior walls of the enclosure 26. The enclosure assembly 26–36 may, then, be described as a piston and cylinder arrangement in which the cylinder is formed by the enclosure 26 and the piston is formed by the shaft or plunger 34 and discoid piston 36. An "O" ring 38 in a groove in the plunger forms a stop against excessive travel of the piston. The enclosure also includes, in a preferred form, a sealing flange 40 which, during shipping and storage, positions the charge forming device and enclosure inside a protective cylinder 42 and which maintains a seal with the walls of the cylinder 42 after the cylinder is opened.

The manufacture may be contained in any number of protective envelopes, but in the preferred embodiment the entire assembly 20 is stored, shipped and handled before use in a glass or quartz cylindrical tube 42 which is hermetically sealed at both ends, enclosing the assembly 20 inside in inert atmosphere, and which includes a scribe mark 44 which permits the tube to be easily broken, allowing the upper portion 46, as shown, to be removed and permitting removal of the assembly 22. A protective ring 48 formed of a semi-rigid, self-lubricating polymer such as Ryton (TM) polysulfide is a desired but non-critical feature of the invention. This ring includes, preferably, a projection which extends into the scribe 44 to assure a safe, clean break.

Finally, the overall assembly 22 and its protective tube 42 is packaged in an inert atmosphere contained in a moisture and vapor impervious flexible package 50 formed of a layer of Mylar (TM) polyterephthalate 52 and metal, such as vapor deposited aluminum 54, sealed in any convenient way as shown, simply as an example, at 56.

FIG. 3 depicts a highly desirable alternative of the assembly of the invention for forming and loading a charge of ion source material which is exceptionally sensitive to contamination or which is to be given ultimate purity protection. In this assembly 120, the charge forming device 122 is the same in all essential features as the device 22 except that it includes a quartz (or in some instances polymeric or borosilicate) seal 123 which hermetically seals the ion source material 124 in the charge shape and size. The enclosure 126–130 is the same as described respecting enclosure 26–30 and the piston 134136 is the same as described respecting piston 134–136, but has the added structure of a breakpoint 137 on the distal side of the piston 136 and may include an additional "O" ring stop 139 to prevent accidental movement of the piston. The operation, which will be described, is the same for this embodiment as for that of FIG. 2 except that the first "O" ring 139 is removed and the breakpoint 137 contacts and breaks the breakseal 123 in the early stages of movement of the piston in the cylinder.

FIG. 4 depicts another alternative embodiment. In this assembly 220, the charge forming device 222 includes a breakseal 223 and is the same as the device 122–123. The charge forming device is recived in a cylindrical enclosure portion 226 which seals at 228, as described with respect to the opening 28 and 128 in the earlier described embodiments. Projections or keys 129 may be provided in this embodiment for engaging the thermal source evaporator 10 to prevent relative rotation therewith. The enclosure purtion includes threads on the outside and a cap 230 which includes an interior structure 232 for engaging the charge forming device and a breakpoint 233 for contacting and ruptureing the breakseal 223. While not necessary, it is sometimes desirable to include a bottom or distal cap 240 which slips on or screws on to the enclosure portion 226, providing an extra measure of protection. The entire assembly may then be enclosed in a glass or quartz tube as described and in an envelope or, as depicted in FIG. 4, simply enclosed in a vapor barrier envelope 250 sealed at 256, of the construction described relative to the package 50–56.

An important feature of the invention is the inclusion as a component of the assembly 20, 120 or 220 of a metal tetrahaloborate charge, and one facet of the invention, a very important facet indeed, is in the improved ion implant method wherein the ion source is obtained by evaporation of the metal tetrahaloborate.

It is customary to carry out the process of ion implantation by the general steps of (a) evaporating a source material; (b) ionizing at least one component of the source material; (c) accelerating the resulting ions; (b) electromagnetically selecting the ions to be implanted in the target; and (e) accelerating and directing a beam of the selected ions to a predetermined point or location on the target. The improvement of this invention is in the first step of evaporating a source material and in a preliminary step of providing a source material.

As background for understanding the significance and importance of this invention, a brief discussion of some factors of great practical and economic, as well as technical, importance is in order.

The ion implant instrument is very expensive, costing a million dollars or more typically, and down-time or non-productive time must, for economic soundness, be avoided and minimized to the greatest possible extent. Down time results whenever it is necessary to shut the instrument down to recharge it with ion source material. In many instances in the prior art, the source vaporizer must be scraped out and a weighed or measured amount of ion source introduced into the well of the source vaporizer. In most instances, this requires that the source vaporizer be introduced into a clean-room or glovebox to prevent contamination of the reagents and spread of the reagents, some of which are extremely poisonous or otherwise hazardous. Those who have worked in a glove box will appreciate that this is a very time consuming and inconvenient operation.

After the charge is loaded into the source vaporizer, the instrument, which operates at high vacuum and an ambient operating temperature of from about 100° to 300° C. must be pumped down and brought up to operating temperature, all of which consumes substantial periods of time. The instrument spectrographic and accelerating chamber operates, for example, at vacuums of as low as $10^{-5}$ torr. The introduction of a charge which requires extensive outgassing or which introduces volatile impurities can slow the start-up of the ion implant instrument significantly. In addition, if the instrument is required to operate at high temperatures, e.g. above 300° C., additional time is required to bring the instrument to a stable operating temperature and additional pumping time may be required.

It is, therefore, a highly sought after goal and a long felt need in the industry to find a method which will reduce down-time, minimize start-up time, and extend run-time between recharging the ion source.

Safety is also a very important consideration. It would be desirable to have an ion source which can be handled safety extreme or unusual precautions or undue risk and which, upon being used up, leaves either no residue or a non-toxic easily removed and safely handle residue.

These and other desirable, long sought after and unexpected results are accomplished by the improved method which comprises the steps of (a) evaporating a metal tetrafluoroborate which evaporates under a vacuum of from approximately $10^{-3}$ to $10^{-5}$ torr in the temperature range of from approximately 100° C. to 400° C. at a rate sufficient to form an effective ion implant beam in an ion implant instrument; (b) ionizing boron; (c) accelerating the boron ions; (d) electromagnetically selecting the boron ions to be implanted in the target; and (e) accelerating and directing a beam of the selected ions to a predetermined point or location on the target.

The article of manufacture is used in the following manner. First, once the source vaporizer is prepared to recieve a charge, the article 20, 120 or 220 is taken from its protective package(s), depending upon the form of packaging used. The article is positioned as shown in FIG. 1 with the source defining device 22 adjacent the well 12 in the source vaporizer, the distal end thereof is then inserted into the well and the article 20 is pressed snuggly against the source vaporizer. In the case of the embodiments of FIGS. 1 and 2, the piston is pressed forcing the charge forming device and charge into the well and, in the case of the article 120, breaking the seal 123 thus opening the charge for use. The article 220 is handled basically in the same way, except that the lid 230 is turned to break the seal 223. This takes only a few seconds and the vaporizer is secured in the ion implant instrument, in the usual and conventional manner, and the ion implant instrument is put back into normal operation. Upon completion of the run, the charge forming device contains the residual $MF_3$ or $M_2F^3$ glass and is simply poured back into the container and disposed of according to regulations which may apply to the particular facility and material.

The most advantageous and greatly preferred form of the inventive process includes evaporating lithium tetrafluoroborate as the first step of the process, and this is selected as best exemplifying the process.

It has been discovered that metal tetrafluoroborates and in particular lithium tetrafluoroborate decomposes and is ionized to form (i) a particularly and unexpectedly pure source of boron ions and (ii) a substantially inert glass. The reaction is described in two steps, as follows:

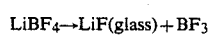

$$LiBF_4 \rightarrow LiF(glass) + BF_3$$

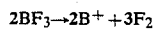

$$2BF_3 \rightarrow 2B^+ + 3F_2$$

The LiF is in the form of a glass which is easily and safely removed from the source vaporizer, fluorine gas is removed through the vacuum system is quantities which are not hazardous in the least, and a beam of boron ions, either $^{10}$B or $^{11}$B as selected, is implanted into the target.

Because of low electrical charge over mass (e/m) ratio of lithium and fluorine the ion charge material has a long run-life, i.e. for a given weight, more boron ions are available than is the case with most ion source materials.

Because the residue is a glass, being essentially inert and nonvolatile, it is easily and safely handled.

Because the lithium tetrafluoroborate evaporates, under a vacuum of about $10^{-3}$, at about 90° C. to 150° C. the warm-up and pump-down time for the instrument is minimal and stable operation is quickly restored after recharging the ion implant source vaporizer.

A high implant current of B+ ions is quickly and easily achieved. For example, a current of 1-3 ma of $^{11}$B+ was repeatably obtained.

Because the source material is a relatively inert, safely handled material, the extreme care and high risk of using such highly reactive and toxic gases as $BF_3$ is avoided. Such $BF_3$ as is generated is in microgram amounts inside the instrument and is decomposed almost immediately, thus presenting no health or safety hazard.

Most of these advantages are obtained using metal tetrahaloborates generally, except that with higher molecular weight halogens, e.g. chlorine and bromine, the run-life is lower because of the lower e/m ratio. Likewise, sodium and potassium analogs would have a shorter run-life than lithium tetrafluoroborate. Notwithstanding that not all of the advantages are obtained using all species, the invention contemplates the use of metal tetrahaloborates generally, principally the haloborate salts of Group I and Group II metals and, preferrably alkali and alkaline earth metals, although zinc tetrafluoroborate and other transition metal tetrahaloborate borates which evaporate in the desired range are also contemplated.

As an article of manufacture, trade and commerce, the invention comprises, in combination, a charge of metal tetrahaloborate, preferrably lithium tetrafluoroborate, charge forming means configuring the charge into a size and shape for being received in a source vaporizer of an ion implant instrument, and enclosure means for enclosing at least a portion of the charge forming means and for positioning the charge forming means in the well of a source vaporizer.

While the invention has been described with reference to the semiconductor industry and in the manufacture of semiconductor materials, e.g. boron implanted into silicon, the invention is of general applicability in, for example, forming corrosion or wear resistant surfaces on bearings, cutting tools, and the like.

Furthermore, while the invention has been described in terms of particular materials of composition, construction and configuration, these (except for the fluoborates) are merely exemplary and great variation is permited, as these are not critical, within the scope, concept and claims of the invention without departing from equivalents of examples and principles hereinbefore setforth.

INDUSTRIAL APPLICATION

This invention finds its most direct and immediate application in the manufacture of semiconductor devices, cutting tools, bearings and other metal objects in which surface characteristics are modified by ion implantation.

What is claimed is:

1. In the method of implanting boron into a substrate which comprises generating a beam of boron ions and directing said beam at the substrate under the influence of electrical and magnetic fields, the improvement wherein the step of generating a beam of boron ions comprises evaporating a charge of metal tetrahaloborate 2. The method of claim 1 wherein the charge consists essentially of a Group I or Group II metal tetrahaloborate.

3. The method of claim 2 wherein the charge consists essentially of an alkali or alkaline earth metal tetrahaloborate.

4. The method of claim 3 wherein the charge consists essentially of an alkali or alkaline earth metal tetrafluoroborate.

5. The method of claim 4 wherein the charge consists essentially of lithium tetrafluoroborate, sodium tetrafluoroborate, calcium tetrafluoroborate or potassium tetrafluoroborate.

6. The method of claim 4 wherein the charge is lithium fluoborate.

7. The method of claim 6 wherein the tetrahaloborate consists essentially of a Group I or Group II metal tetrahaloborate.

8. The method of claim 7 wherein the tetrahaloborate consists essentially of an alkali or alkaline earth metal tetrafluoroborate.

9. The method of claim 8 wherein the tetrahaloborate consists essentially of lithium tetrafluoroborate, sodium tetrafluoroborate, calcium tetrafluoroborate or potassium tetrafluoroborate.

10. The method of claim 9 wherein the tetrahaloborate is lithium fluoborate.

11. In a method for implanting an element, in the form of ions thereof, into a target comprising the steps of evaporating a compound of said element, ionizing said compound to form ions of said element, accelerating the said ions, electromagnetically selecting the element ions to be implanted into such target, and accelerating and directing a beam of the selected ions to a predetermined location on such target, the improvement wherein the compound is a metal tetrahaloborate which evaporates under a vacuum of from approximately $10^{-3}$ to $10^{-5}$ torr in a temperature range of from approximately 100° C. to 400° C. at a rate sufficient to form an effective ion implant beam in an ion implant instrument, and wherein the compound ions are boron ions resulting from the ionization of the tetrahaloborate.

* * * * *